United States Patent
Narawade et al.

(10) Patent No.: US 12,119,823 B2
(45) Date of Patent: Oct. 15, 2024

(54) WIDE FREQUENCY RANGE VOLTAGE CONTROLLED OSCILLATOR

(71) Applicant: Open Silicon, Inc., Milpitas, CA (US)

(72) Inventors: Santosh Mahadeo Narawade, Bangalore (IN); Jithin K, Bangalore (IN); Mohit Gupta, San Jose, CA (US)

(73) Assignee: Alphawave Semi, Inc., Milpitas, CA (US)

(*) Notice: Subject to any disclaimer, the term of this patent is extended or adjusted under 35 U.S.C. 154(b) by 18 days.

(21) Appl. No.: 18/071,162

(22) Filed: Nov. 29, 2022

(65) Prior Publication Data
US 2023/0170884 A1 Jun. 1, 2023

Related U.S. Application Data

(60) Provisional application No. 63/284,342, filed on Nov. 30, 2021.

(51) Int. Cl.
H03K 3/0231 (2006.01)
H03K 3/014 (2006.01)
H03K 3/03 (2006.01)
H03K 5/133 (2014.01)
H03L 7/099 (2006.01)

(52) U.S. Cl.
CPC .......... *H03K 3/0231* (2013.01); *H03K 3/014* (2013.01); *H03K 3/0315* (2013.01); *H03K 5/133* (2013.01); *H03L 7/0995* (2013.01); *H03K 3/0322* (2013.01)

(58) Field of Classification Search
CPC .... H03K 3/0322; H03K 3/0315; H03K 3/014; H03L 7/0995; H03L 3/00
See application file for complete search history.

(56) References Cited

U.S. PATENT DOCUMENTS

| | | | |
|---|---|---|---|
| 6,771,105 B2 | 8/2004 | Andrasic et al. | |
| 2003/0155955 A1* | 8/2003 | Andrasic | H03K 3/354 327/277 |
| 2005/0046495 A1* | 3/2005 | Li | H03L 7/0995 331/57 |
| 2010/0085127 A1* | 4/2010 | Saurabh | H03L 1/022 331/186 |

OTHER PUBLICATIONS

ISSCC96 | Session 8 / Digital Clocks and Latches | Paper FA 8.1, Low-Jitter and Process-Independent DLL and PLL Based on Self-Biased Techniques by John G. Maneatis, 1996, 3 pages.
Design of CMOS Adaptive-Bandwidth PLL/DLLs: A General Approach by Jaeha Kim, Member, IEEE, Mark A. Horowitz, Fellow, IEEE, and Gu-Yeon Wei, Member, IEEE, Nov. 2003, 10 pages.

* cited by examiner

*Primary Examiner* — Ryan Johnson
(74) *Attorney, Agent, or Firm* — Young Basile Hanlon & MacFarlane, P.C.

(57) ABSTRACT

Systems and methods are disclosed for wide frequency range voltage controlled oscillators. For example, an apparatus includes a Voltage Controlled Oscillator (VCO) including a delay cell which includes first and second current sources provided in parallel with one another. The first current source is controlled by a voltage control input connected to a voltage control terminal and the second current source is controlled by a bias voltage input connected to a bias voltage terminal. The first current source provides an alternate current path in the delay cell when the second current source is off. The delay cell is operable to receive an input and produce an output using the alternate current path.

20 Claims, 10 Drawing Sheets

800

810

SUPPLYING AN INPUT TO A VCO INCLUDING A DELAY CELL, THE DELAY CELL INCLUDING FIRST AND SECOND CURRENT SOURCES IN PARALLEL, THE FIRST CURRENT SOURCE CONTROLLED BY A VOLTAGE CONTROL INPUT, THE SECOND CURRENT SOURCE CONTROLLED BY A BIAS VOLTAGE INPUT, THE FIRST CURRENT SOURCE PROVIDING AN ALTERNATE CURRENT PATH IN THE DELAY CELL WHEN THE SECOND CURRENT SOURCE IS OFF, THE DELAY CELL PRODUCING AN OUTPUT USING THE ALTERNATE CURRENT PATH

FIG. 8

WIDE FREQUENCY RANGE VOLTAGE CONTROLLED OSCILLATOR

CROSS-REFERENCE TO RELATED APPLICATION(S)

This application claims priority to and the benefit of U.S. Provisional Patent Application Ser. No. 63/284,342, filed Nov. 30, 2021, the entire disclosure of which is hereby incorporated by reference.

TECHNICAL FIELD

This disclosure relates generally to voltage controlled oscillators and, more specifically, to wide frequency range voltage controlled oscillators.

BACKGROUND

A Voltage Controlled Oscillator (VCO) is an electronic circuit that produces a periodic, oscillating electrical signal whose oscillation frequency is controlled by a voltage control input. A VCO may be implemented in an electronic system as part of a Phase Lock Loop (PLL). A PLL is an electronic control system used to generate an output electrical signal whose phase substantially matches an input reference signal. In many systems, a PLL receives a lower frequency oscillating reference signal and, in turn, uses a VCO to produce a higher frequency oscillating output signal that is phase locked to the reference signal. For example, the output signal of the PLL may be used to supply a higher frequency clock in an electronic system such as Central Processing Unit. Additionally, the output signal of the PLL may be frequency divided and compared by the PLL to the reference signal to determine a phase error (or mismatch) for adjusting the voltage control input of the VCO to minimize the error in a feedback loop.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIG. 8 is a flow chart of another example of a process for implementing a wide frequency range VCO.

DETAILED DESCRIPTION

Figure 1:
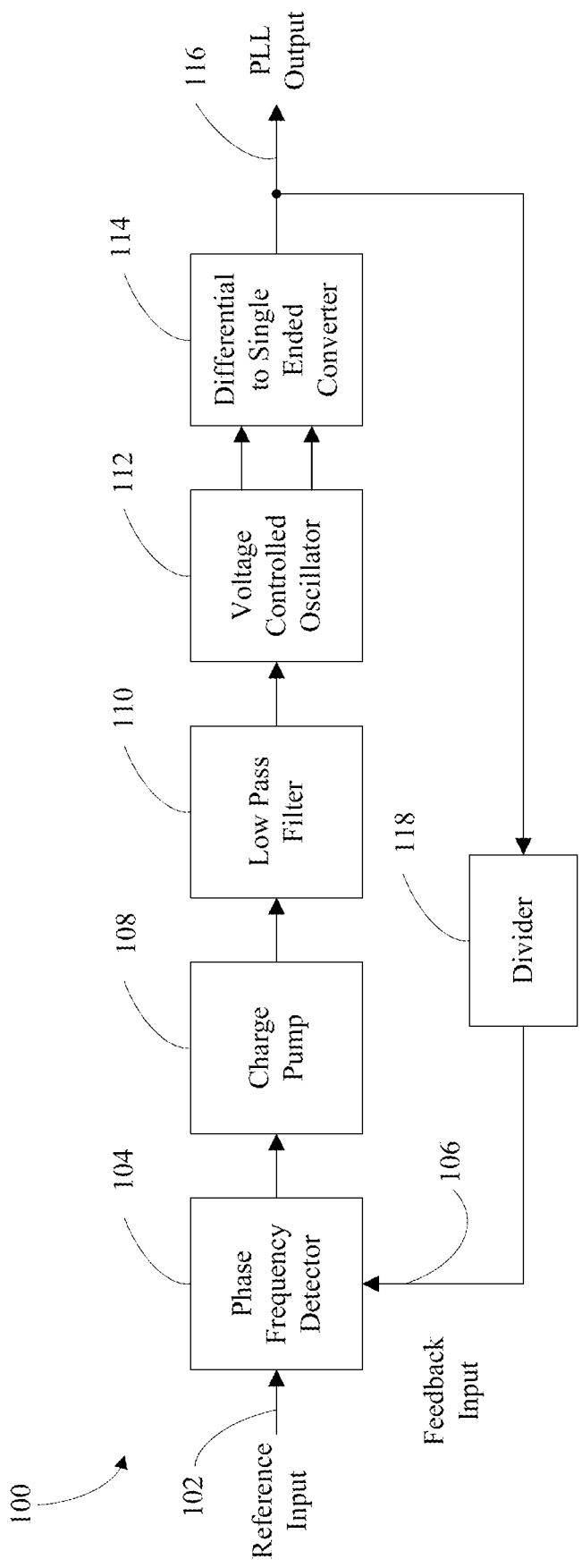
FIG. 1 is a block diagram of an example of a Phase Lock Loop (PLL).

A Phase Lock Loop (PLL) implementing a Voltage Controlled Oscillator (VCO) may be "self-biased" in which a voltage control input ($V_{CONTROL}$) and a bias voltage input ($V_{BIAS}$) (generated by a bias circuit from the voltage control input ($V_{CONTROL}$)) are used to control delay in multiple cells (or "delay cells") arranged in a ring. In each cell, the voltage control input ($V_{CONTROL}$) controls a current source, such as a PMOS (P-channel metal oxide semiconductor) transistor connected to a power supply, while the bias voltage input ($V_{BIAS}$) adjusts voltage and current, in response to the voltage control input ($V_{CONTROL}$), across a load, such as a differential pair of NMOS (N-channel metal oxide semiconductor) transistors. The voltage control input and bias voltage applied to each cell in the ring allows the cells to delay an electrical signal propagating through the ring in proportion to the voltage control input ($V_{CONTROL}$). This, in turn, allows the VCO to generate an oscillating electrical output signal at a frequency controlled by the voltage control input ($V_{CONTROL}$), which, in turn, allows the PLL to produce a higher frequency output signal.

Electronic systems increasingly require higher clock frequencies to achieve greater performance. However, PLLs may be limited to a given loop bandwidth (or frequency range) based on their design, the voltage control input ($V_{CONTROL}$) applied, and/or the load being driven. A PLL may perform optimally at a targeted center frequency, such as 3 GHz, but outside of the PLL's designed loop bandwidth, such as outside of ±10 or 20% of the targeted center frequency, the PLL may be unable to lock, even with a reduced frequency of the reference signal. For example, for a self-biased PLL design, the loop bandwidth may be limited by saturation of the bias circuit causing the VCO to be limited to a particular lower frequency value. Saturation of the bias circuit may occur when the voltage control input ($V_{CONTROL}$) falls below a threshold voltage of an input transistor of an operational amplifier of the bias circuit. Saturation of the operational amplifier, in turn, limits the bias voltage input ($V_{BIAS}$) being generated, which, in turn, limits the VCO to the lower frequency value. Accordingly, a PLL designed for a higher frequency, such as 3 GHz, may fail to lock when used to generate a lower frequency that is outside of the PLL's loop bandwidth, such as 50 MHz. Conversely, a PLL designed for a lower frequency, such as 50 MHz, may fail to lock when used to generate a higher frequency that is outside of the PLL's loop bandwidth, such as 3 GHz.

Techniques which attempt to design a PLL for a wider loop bandwidth, e.g., greater than ±10 or 20% of a targeted center frequency, may result in an undesirable increase in the design size and/or settling time (i.e., amount of time to reach a steady state operation). Thus, systems may instead implement multiple PLLs with individually tuned designs for producing output signals at differing frequencies, e.g., a first PLL for generating a lower frequency output and a second PLL for generating a higher frequency output. However, having multiple PLLs in a system also complicates the system and requires additional space and power to implement. Accordingly, there is a need for a PLL which functions over a wide frequency range, such as from 50 MHz to 3 GHz, with a reduced design size and/or settling time as compared to existing PLLs.

Additionally, PLLs also may use start-up circuitry for initializing their operation. For example, for a self-biased PLL, start-up circuitry may be included to clamp the voltage control input ($V_{CONTROL}$) and the bias voltage input ($V_{BIAS}$) to levels which allow the VCO delay cells to begin operation. Without such start-up circuitry, the bias voltage input ($V_{BIAS}$) could possibly start at or near the power supply voltage ($V_{DD}$) and the voltage control input ($V_{CONTROL}$) could possibly start at or near ground ($V_{SS}$). This, in turn, could prevent a current source PMOS transistor (controlled by the bias voltage input ($V_{BIAS}$)) from sourcing current and prevent NMOS load transistors (controlled by the voltage control input ($V_{CONTROL}$)) from conducting current, thereby causing a failure of the VCO to begin operation. Thus, systems may implement start-up circuitry to resolve this condition, such as by initializing the bias voltage input ($V_{BIAS}$) to ground ($V_{SS}$) and the voltage control input ($V_{CONTROL}$) to the power supply voltage ($V_{DD}$). However, having start-up circuitry also increases complexity and may require additional space and power to implement. Accordingly, there is a need for a PLL which may simplify or obviate the need for start-up circuitry.

Described herein are VCO architectures that, used within the context of a PLL, permit a PLL to produce a wider frequency range without increasing the design size and/or settling time of the PLL. Additionally, described herein are VCO architectures that allow for the simplification of or elimination of start-up circuitry. In some implementations, an improved wide frequency range VCO is provided in which each delay cell of the VCO includes first and second current sources provided in parallel with one another, the first current source being controlled by a voltage control input connected to a voltage control terminal and the second current source being controlled by a bias voltage input connected to a bias voltage terminal. The first current source provides an alternate current path in the delay cell when the second current source is off. The delay cell is operable to receive an input and produce an output using the alternate current path. By providing the alternate current path via the first current source, the delay cell can provide sufficient current in the cell for allowing a wide frequency range despite the second current source being off, such as due to saturation of the bias circuit. Providing the alternate current path via the first current source also enables the delay cell to initialize operation while simplifying start-up circuitry, such as by eliminating circuitry which would initialize the bias voltage input ($V_{BIAS}$) to ground ($V_{SS}$) for a current source PMOS transistor and initialize the voltage control input ($V_{CONTROL}$) to the power supply ($V_{DD}$) for NMOS load transistors.

As used herein, the phrase "current source" refers to an electronic circuit or component thereof that is configured to deliver or absorb an electric current independent of an electric voltage applied to it. A "current source" may be configured as a "current sink" when connected to a negative voltage supply or ground. Further, as used herein, the term "circuit" refers to an arrangement of electronic components (e.g., transistors, resistors, capacitors, and/or inductors) that is structured to implement one or more functions. For example, a circuit may include one or more transistors interconnected to form logic gates that collectively implement a logical function.

FIG. 1 is a block diagram of an example of a PLL 100. The PLL 100 may be a self-biased PLL which includes a phase frequency detector 104; a charge pump 108; a low pass filter 110; a VCO 112; a differential to single ended converter 114; and a divider 118. At a PLL input node 102, the phase frequency detector 104 receives an oscillating electrical reference signal ("reference input") having a phase and frequency. Additionally, at a PLL feedback node 106, the phase frequency detector 104 receives an oscillating electrical feedback signal ("feedback input") also having a phase and frequency. The phase frequency detector 104 compares the phase and/or frequency of the reference input to the phase and/or frequency of the feedback input to determine a PLL phase and/or frequency error (or mismatch) for adjusting the PLL. The phase frequency detector 104, in turn, produces a detector output comprising the error. The charge pump 108, in turn, receives the detector output and produces a charge pump output which also comprises the error. The charge pump 108 may include, for example, a bipolar switched current source configured to produce an output having positive and negative current pulses configured for a low pass filter. Next, the low pass filter 110 receives the charge pump output and produces a low pass filter output which also comprises the error.

The VCO 112 receives the low pass filter output as a voltage control input ($V_{CONTROL}$). The VCO 112 implements a bias circuit and multiple delay cells arranged in a ring. The bias circuit is configured to generate a bias voltage input ($V_{BIAS}$) from the voltage control input ($V_{CONTROL}$) for biasing the delay cells. Each delay cell in the ring receives the voltage control input ($V_{CONTROL}$) and the bias voltage input ($V_{BIAS}$) for controlling delay of a differential oscillating electrical signal ("differential signal") propagating through the ring. The VCO 112 typically implements a multiplication function (*N) that is operable to generate the differential signal at a frequency that is a multiple of the frequency of the reference input, e.g., supplied to the phase frequency detector 104 at the PLL input node 102. Additionally, the VCO 112 is operable to increase or decrease the frequency of the differential signal through a wide frequency range with a corresponding increase or decrease in the voltage control input ($V_{CONTROL}$). For example, if the phase frequency detector 104 determines a frequency of the reference signal, i.e., the differential signal conditioned and divided, is less than a frequency of the feedback signal, i.e., a negative error, the PLL 100 may decrease the voltage control input ($V_{CONTROL}$) to cause the VCO 112 to decrease the frequency of the differential signal. Conversely, if the phase frequency detector 104 determines the frequency of the reference signal is greater than the frequency of the feedback signal, i.e., a positive error, the PLL 100 may increase the voltage control input ($V_{CONTROL}$) to cause the VCO 112 to increase the frequency of the differential signal.

Next, the differential to single ended converter 114 receives the differential signal from the VCO 112 and conditions the differential signal to produce a single ended oscillating electrical PLL output signal ("PLL output") at a PLL output node 116. As the VCO 112 typically implements a multiplication function (*N) over the reference input, the PLL output will reflect that multiplication function. For example, with a frequency of the reference signal being 50 MHz, and a multiplication function of sixty (N=60) implemented by the VCO 112, the frequency of the PLL output may be 3 GHz (i.e., 50 MHz*60). The PLL output may be supplied to components in an electronic system, such as a clock for a Central Processing Unit.

The divider 118 receives the PLL output and implements a divider function (/N) to divide the frequency of the PLL output, based on the multiplication function implemented by the VCO 112, to produce an oscillating electrical divider output signal ("divider output") at the PLL feedback node 106. For example, with a frequency of the PLL output being 3 GHz, and a multiplication function of sixty (N=60) implemented by the VCO 112, the frequency of the divider output would be 50 MHz (i.e., 3 GHz/60). The phase frequency detector 104, in turn, receives the divider output as the feedback signal at the PLL feedback node 106. The phase frequency detector 104 again compares the phase and/or frequency of the reference input to the phase and/or frequency of the feedback input to determine a revised PLL phase and/or frequency error for adjusting the PLL. This process repeats in a loop as the PLL 100 locks the PLL output to a given reference input.

Figure 2:
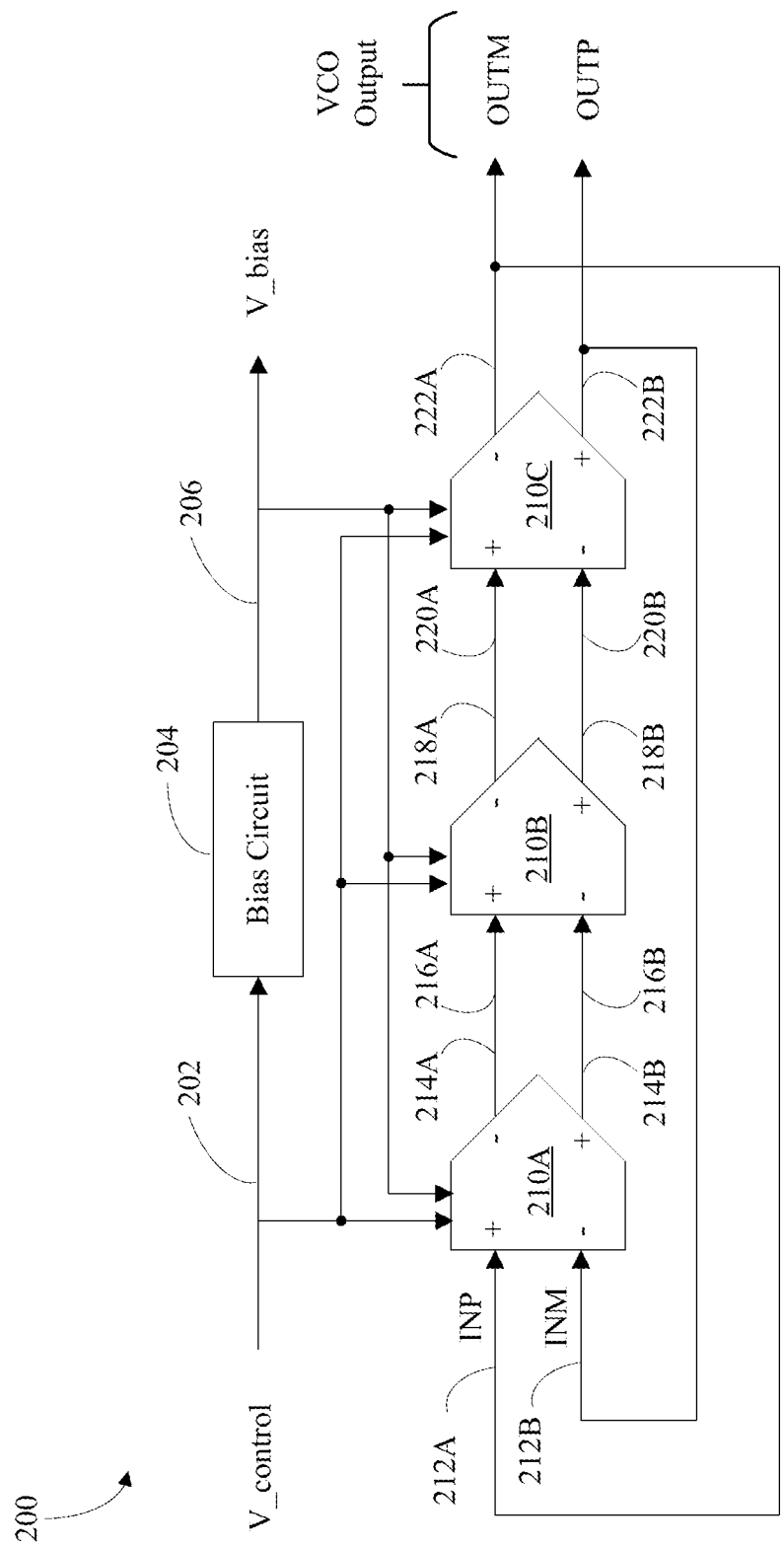
FIG. 2 is a block diagram of an example of a wide frequency range Voltage Controlled Oscillator (VCO) implemented by a PLL.

FIG. 2 is a block diagram of an example of a wide frequency range VCO 200 implemented by a PLL. In one configuration, the VCO 200 may be the VCO 112 implemented by the PLL 100 shown in FIG. 1. The VCO 200 includes a bias circuit 204 and multiple delay cells or stages arranged in a ring, such as delay cells 210A through 210C. While three delay cells are shown by way of example, any odd number of delay cells may be used. In operation, the bias circuit 204 receives a voltage control input ($V_{CONTROL}$) at a voltage control terminal 202 and generates a bias voltage input ($V_{BIAS}$) at a bias voltage terminal 206. The bias circuit 204 may implement, for example, a replica-feedback architecture, such as an operational amplifier and a replica of transistors implemented in a delay cell, such as one of the delay cells 210A through 210C. The voltage control input ($V_{CONTROL}$) and the bias voltage input ($V_{BIAS}$) are supplied to the delay cells 210A through 210C in the ring to control delay of a differential signal propagating though the ring. The differential signal may be output from the VCO 200 ("VCO output") for generating a PLL output at a given frequency.

For example, a first delay cell 210A in the ring receives differential inputs 212A and 212B ("INP" and "INM"). Based on the voltage control input ($V_{CONTROL}$) and the bias voltage input ($V_{BIAS}$), the first delay cell 210A delays the differential inputs by an amount of time to produce inverted differential outputs 214A and 214B ("OUTM" and "OUTP"). A second delay cell 210B in the ring receives the differential outputs 214A and 214B as differential inputs 216A and 216B ("INP" and "INM") and, based on the voltage control input ($V_{CONTROL}$) and the bias voltage input ($V_{BIAS}$), also delays the differential inputs by the amount of time to produce inverted differential outputs 218A and 218B ("OUTM" and "OUTP"). A third delay cell 210C in the ring receives the differential outputs 218A and 218B as differential inputs 220A and 220B ("INP" and "INM") and, based on the voltage control input ($V_{CONTROL}$) and the bias voltage input ($V_{BIAS}$), also delays the differential inputs by the amount of time to produce inverted differential outputs 222A and 222B ("OUTM" and "OUTP"). The first delay cell 210A receives the inverted differential outputs 222A and 222B as the differential inputs 212A and 212B in the ring configuration. Additionally, the differential outputs 222A and 222B may be used as a VCO output for generating the PLL output at a desired frequency.

Figure 3:
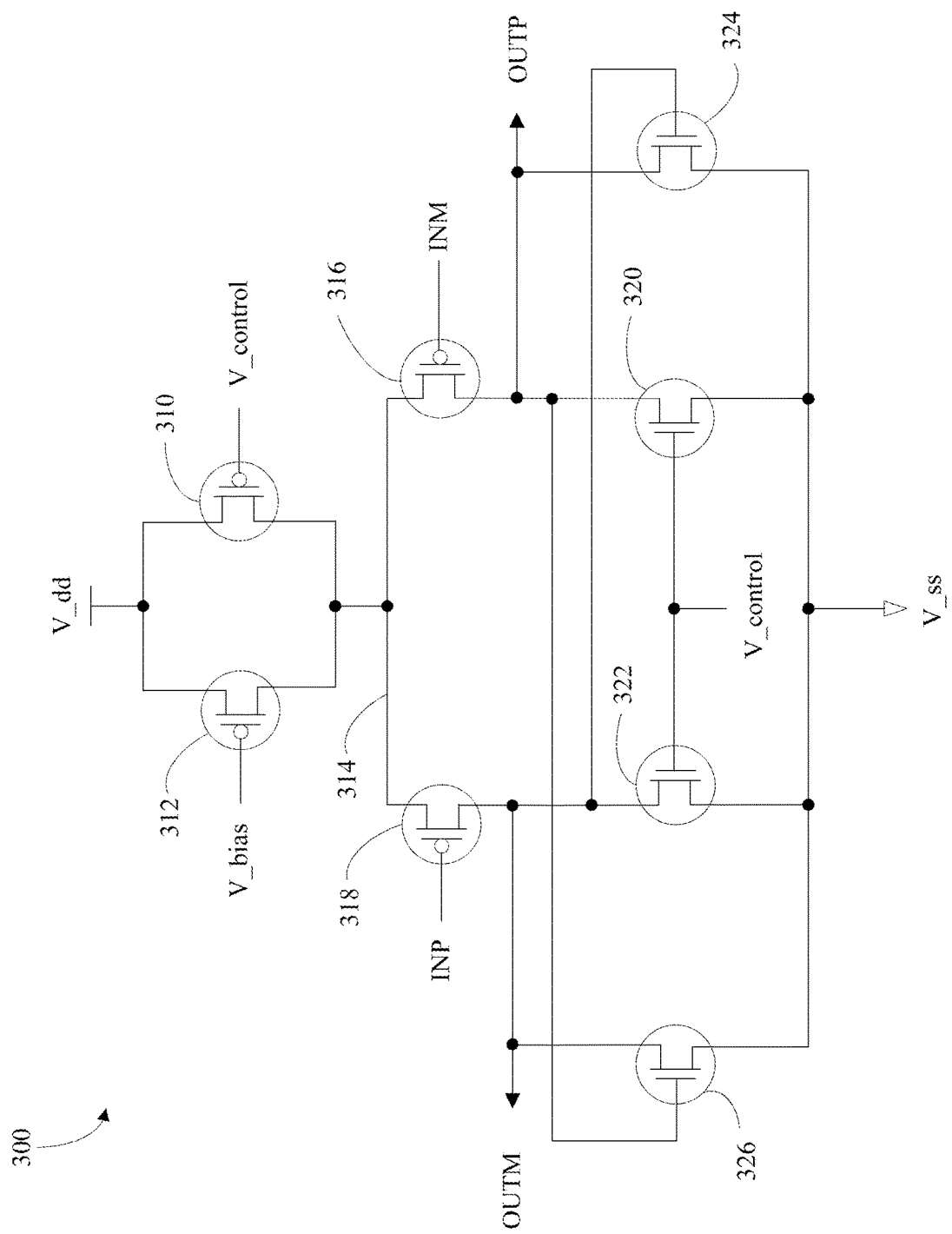
FIG. 3 is a circuit diagram of an example of a delay cell implemented by a VCO.

FIG. 3 is a circuit diagram of an example of a delay cell 300 which may be implemented by a wide frequency range VCO, such as one of the delay cells 210A through 210C implemented by the VCO 200 shown in FIG. 2. The delay cell 300 includes first and second current sources in parallel with one another. In some implementations, the first and second current sources may be first and second current source PMOS transistor 310 and 312, respectively. The first current source is controlled by a voltage control input ($V_{CONTROL}$) and the second current source is controlled by a bias voltage input ($V_{BIAS}$) generated by a bias circuit, such as such as the bias circuit 204 shown in FIG. 2.

In some implementations, the first current source PMOS transistor 310 is implemented with its source connected to a power supply ($V_{DD}$), its drain connected to a common node 314, and its gate connected to the voltage control input ($V_{CONTROL}$) at a voltage control terminal. Current through the first current source PMOS transistor 310, from source to drain, e.g., source current, is dynamically controlled by the voltage control input ($V_{CONTROL}$) applied to its gate. In some implementations, the second current source is implemented with its source connected to the power supply ($V_{DD}$), its drain connected to the common node 314, and its gate connected to the bias voltage input ($V_{BIAS}$) at a bias voltage terminal. Current through the second current source PMOS transistor 312, from source to drain, e.g., source current, is dynamically controlled by the bias voltage input ($V_{BIAS}$) applied its gate.

In some implementations, the delay cell 300 further includes first and second input PMOS transistors 316 and 318, respectively. The first input PMOS transistor 316 is implemented with its source connected to the common node 314, its gate connected to a first input ("INM"), and its drain connected to a first output ("OUTP"). The second input PMOS transistor 318 is implemented with its source connected to the common node 314, its gate connected to a second input ("INP"), and its drain connected to a second output ("OUTM"). The first and second inputs ("INM" and "INP") may be differential inputs to the delay cell 300, and the first and second outputs ("OUTP" and "OUTM") may be inverted differential outputs from the delay cell 300. Based on the voltage control input ($V_{CONTROL}$) and the bias voltage input ($V_{BIAS}$), the delay cell 300 delays the differential inputs ("INM" and "INP") by an amount of time to produce the differential outputs ("OUTM" and "OUTP").

Additionally, in some implementations, the delay cell 300 includes a first pair of NMOS transistors and a second pair of cross-coupled NMOS transistors (cross-coupled with the first pair). The first and second pairs of NMOS transistors are operable in the delay cell 300 as symmetric loads. Typically, a size of the first pair of NMOS transistors is larger than a size of the second pair of cross-coupled NMOS transistors, such that the first pair of NMOS transistors conducts more current, and therefore dominates more in operation of the delay cell 300, than the second pair of cross-coupled NMOS transistors. In some implementations, the first pair of NMOS transistors is at least five times larger than the second pair of cross-coupled NMOS transistors.

In some implementations, the first pair of NMOS transistors includes first and second NMOS transistor 320 and 322, respectively. The first NMOS transistor 320 is implemented with its source connected to ground ($V_{SS}$), its gate connected to the voltage control input ($V_{CONTROL}$), and its drain connected to the first output ("OUTP"). The second NMOS transistor 322 is implemented with its source connected to ground ($V_{SS}$), its gate connected to the voltage control input ($V_{CONTROL}$), and its drain connected to the second output ("OUTM"). Thus, the first pair of NMOS transistors are controlled by the voltage control input ($V_{CONTROL}$) to allow current to flow, e.g., source from the first and/or second current source PMOS transistors 310 or 312, respectively, in the delay cell 300.

In some implementations, the second pair of cross-coupled NMOS transistors includes first and second cross-coupled NMOS transistors 324 and 326, respectively. The first cross-coupled NMOS transistor 324 is implemented with its source connected to ground ($V_{SS}$), its gate connected to the drain of the second NMOS transistor 322, i.e., cross-coupled with the second NMOS transistor 322, and its drain connected to the first output ("OUTP"). The second cross-coupled NMOS transistor 326 is implemented with its source connected to ground ($V_{SS}$), its gate connected to the drain of the first NMOS transistor 320, i.e., cross-coupled with the first NMOS transistor 320, and its drain connected to the second output ("OUTM"). Thus, the second pair of cross-coupled NMOS transistors are controlled by the first and/or second current source PMOS transistors 310 or 312, respectively, to allow current to flow, e.g., source from the first and/or second current source PMOS transistors 310 or 312, respectively, in the delay cell 300.

In operation, the delay cell 300 receives the differential inputs ("INM" and "INP") and, following a delay controlled by the voltage control input ($V_{CONTROL}$), produces the differential outputs ("OUTM" and "OUTP"). The differential outputs may be output from the VCO for generating a PLL output at a given frequency To provide a wide frequency range of the PLL, the first current source PMOS transistor 310 provides an alternate current path in the delay cell 300 when the second current source PMOS transistor 312 is off (not conducting current from source to drain). The second current source PMOS transistor 312 may be off, for example, due to saturation of the bias circuit driving the bias voltage input ($V_{BIAS}$) to the power supply ($V_{DD}$). The alternate current path allows current to source from the first current source PMOS transistor 310, from source to drain, through the first and second input PMOS transistor 316 and 318, respectively, from source to drain, and through at least the first and second cross-coupled NMOS transistors 324 and 326, respectively, from drain to source. This alternate current path provides increased current in the delay cell 300 so that a low voltage control input ($V_{CONTROL}$) at or near ground ($V_{SS}$), adjusted to maximize a delay in the cell, and causing saturation of the bias circuit driving the bias voltage input ($V_{BIAS}$) to the power supply ($V_{DD}$), does not inhibit operation of the cell, but rather allows the cell to operate through a wider frequency range. With the alternate current path, delay may be maximized in each cell to achieve a lower frequency than would otherwise be attainable, such as 50 MHz for a PLL having a loop bandwidth between 50 MHz and 3 GHz. Additionally, a high voltage control input ($V_{CONTROL}$) at or near the power supply ($V_{DD}$), adjusted to minimize the delay in the cell, is operable via source current through the second current source PMOS transistor 312, from source to drain, through the first and second input PMOS transistor 316 and 318, respectively, from source to drain, and through the first and second NMOS transistors 320 and 322, respectively, from drain to source. This allows delay to be minimized in each delay cell to achieve a higher frequency, such as 3 GHz for the PLL operating between 50 MHz and 3 GHz. Additionally, the alternate current path permits an output with less than 2% jitter and changing from one frequency to another with reduced settling time. For example, the VCO may produce an output with less than 2% jitter at a first frequency, such as less than 500 MHz, and then adjust during a settling time of less than 2000 cycles of the output, and more preferably less than 1000 cycles of the output, to produce the output with less than 2% jitter at a second frequency, such as greater than 2 GHz.

Additionally, to simplify start-up circuitry used by the PLL, the first current source PMOS transistor 310 provides the alternate current path in the delay cell 300 when the second current source PMOS transistor 312 is off during initialization (not conducting current from source to drain). For example, the second current source PMOS transistor 312 may be off during a start-up condition in which the bias voltage input ($V_{BIAS}$) starts at the power supply ($V_{DD}$). The alternate current path may provide a source current in the delay cell 300 during such initialization of the PLL, including the delay cell 300, so that the bias voltage input ($V_{BIAS}$) starting at the power supply ($V_{DD}$) does not stop the cell from beginning operation. As a result, implementations disclosed herein may allow simplifying start-up circuitry used by a PLL.

Figure 4:
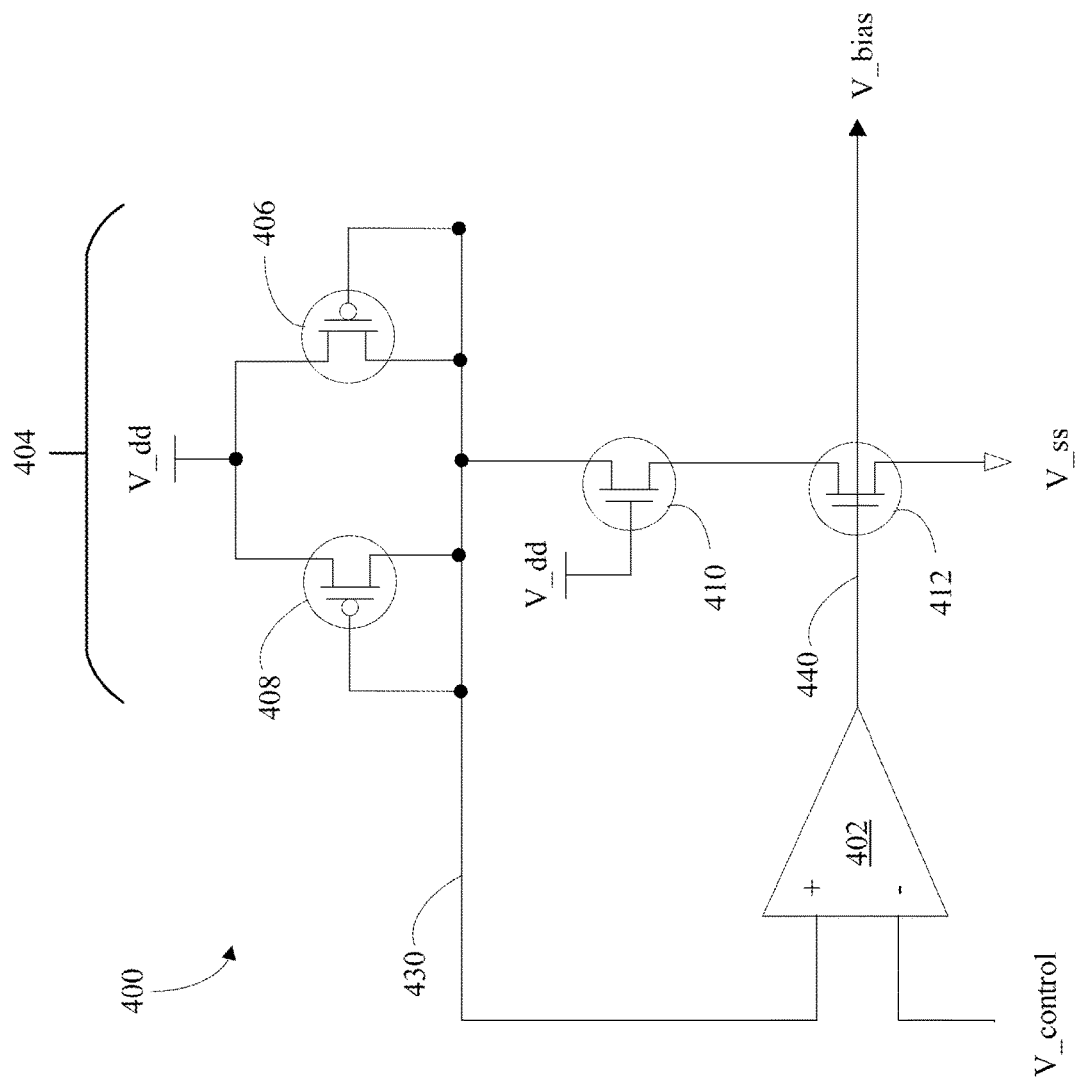
FIG. 4 is a circuit diagram of an example of a bias circuit for a delay cell.

FIG. 4 is a circuit diagram of an example of a bias circuit 400 which may be used to generate a bias voltage input ($V_{BIAS}$) for a VCO, such as the bias circuit 204 shown in FIG. 2. The bias circuit 400 may receive a voltage control input ($V_{CONTROL}$) at a voltage control terminal and, in turn, generate the bias voltage input ($V_{BIAS}$) at a bias voltage terminal. The bias voltage input ($V_{BIAS}$) may then be supplied to a delay cell, such as the delay cell 300 shown in FIG. 3. In some implementations, the bias circuit 400 may comprise a replica-feedback current source bias circuit including an operational amplifier 402 connected to a replica circuit 404. The replica circuit 404 may include, for example, transistors 406, 408, 410, and 412 replicated from a delay cell. In operation, the operational amplifier 402 receives the voltage control input ($V_{CONTROL}$) and a feedback signal 430 and drives an output 440 to the replica circuit 404 to generate each of the bias voltage input ($V_{BIAS}$) and the feedback signal 430 in a loop.

As disclosed herein, the bias circuit 400 may encounter a condition in which the voltage control input ($V_{CONTROL}$) falls below a threshold voltage of an input transistor of the operational amplifier 402. This may cause the operational amplifier 402 to saturate, which, in turn, saturates or limits the bias voltage input ($V_{BIAS}$) generated by the operational amplifier 402. Saturation of the bias voltage input ($V_{BIAS}$) causes delay cells of the VCO to be limited to a lower frequency value. This, in turn, narrows the frequency range. However, in a delay cell with first and second current sources in parallel with one another as disclosed herein, such as the first and second current source PMOS transistors 310 and 312, respectively, as shown in FIG. 3, an alternate current path is provided in the delay cell. With the alternate current path, a low voltage control input ($V_{CONTROL}$) at or near ground ($V_{SS}$) does not inhibit operation of the cell, but instead allows the cell to operate through a wider frequency range.

Figure 5:
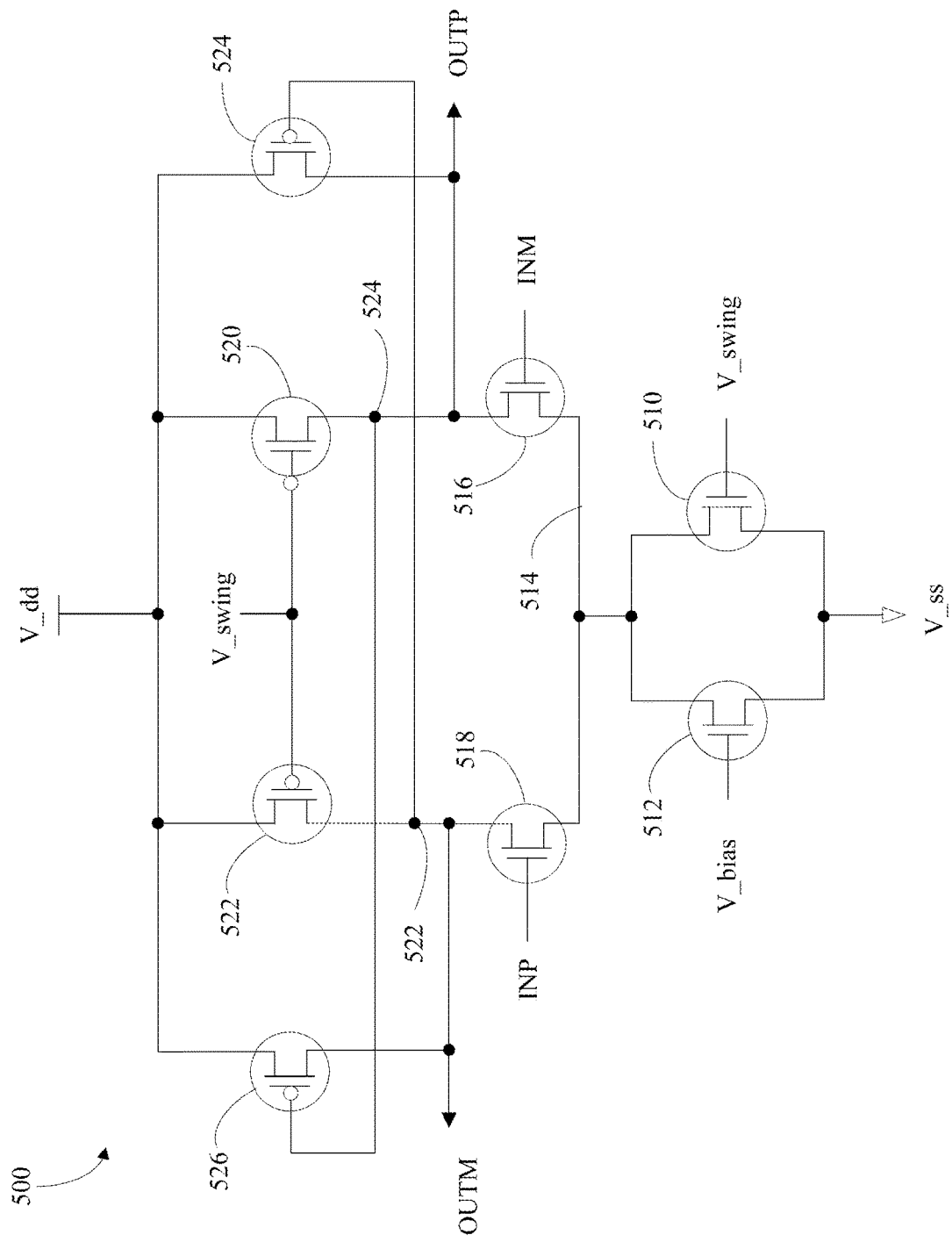
FIG. 5 is a circuit diagram of another example of a delay cell implemented by a VCO.

FIG. 5 is a circuit diagram of another example of a delay cell 500 which may be implemented by a wide frequency range VCO, such as one of the delay cells 210A through 210C implemented by the VCO 200 shown in FIG. 2. The delay cell 500 includes first and second current sources, configured as first and second current sinks connected to ground. The first and second current sinks are in parallel with one another. In some implementations, the first and second current sinks may be first and second current sink NMOS transistor 510 and 512, respectively. The first current sink may be controlled by a voltage swing input ($V_{SWING}$) derived from the voltage control input ($V_{CONTROL}$) and the power supply ($V_{DD}$), such as $V_{SWING}=V_{DD}-V_{CONTROL}$. Thus, the first current sink may be indirectly controlled by the voltage control input ($V_{CONTROL}$). The second current sink is controlled by a bias voltage input ($V_{BIAS}$) generated by a bias circuit, such as such as the bias circuit 204 shown in FIG. 2.

In some implementations, the first current sink NMOS transistor 510 is implemented with its source connected to ground ($V_{SS}$), its drain connected to a common node 514, and its gate connected to the voltage swing input ($V_{SWING}$) at a voltage swing terminal. Current through the first current sink NMOS transistor 510, from drain to source, e.g., sink current or tail current, is dynamically controlled by the voltage swing input ($V_{SWING}$) applied to its gate. In some implementations, the second current sink NMOS transistor 512 is implemented with its source connected to ground ($V_{SS}$), its drain connected to the common node 514, and its gate connected to the bias voltage input ($V_{BIAS}$) at a bias voltage terminal. Current through the second current sink NMOS transistor 512, from drain to source, e.g., sink current or tail current, is dynamically controlled by the bias voltage input ($V_{BIAS}$) applied its gate.

In some implementations, the delay cell 500 further includes first and second input NMOS transistors 516 and 518, respectively. The first input NMOS transistor 516 is implemented with its source connected to the common node 514, its gate connected to a first input ("INM"), and its drain connected to a first output ("OUTP"). The second input NMOS transistor 518 is implemented with its source connected to the common node 514, its gate connected to a second input ("INP"), and its drain connected to a second output ("OUTM"). The first and second inputs ("INM" and "INP") may be differential inputs to the delay cell 500, and the first and second outputs ("OUTP" and "OUTM") may be inverted differential outputs from the delay cell 500. Based on the voltage swing input ($V_{SWING}$) and the bias voltage input ($V_{BIAS}$), the delay cell 500 delays the differential inputs ("INM" and "INP") by an amount of time to produce the differential outputs ("OUTM" and "OUTP").

Additionally, in some implementations, the delay cell 500 includes a first pair of PMOS transistors and a second pair of cross-coupled PMOS transistors (cross-coupled with the first pair). The first and second pairs of PMOS transistors are operable in the delay cell 500 as symmetric loads. Typically, a size of the first pair of PMOS transistors is larger than a size of the second pair of cross-coupled PMOS transistors, such that the first pair of PMOS transistors conducts more current, and therefore dominates more in operation of the delay cell 500, than the second pair of cross-coupled PMOS transistors. In some implementations, the first pair of PMOS transistors is at least five times larger than the second pair of cross-coupled PMOS transistors.

In some implementations, the first pair of PMOS transistors includes first and second PMOS transistors 520 and 522, respectively. The first PMOS transistor 520 is implemented with its source connected to a power supply ($V_{DD}$), its gate connected to the voltage swing input ($V_{SWING}$), and its drain connected to the first output ("OUTP"). The second PMOS transistor 522 is implemented with its source connected to the power supply ($V_{DD}$), its gate connected to the voltage swing input ($V_{SWING}$), and its drain connected to the second output ("OUTM"). Thus, the first pair of PMOS transistors are controlled by the voltage swing input ($V_{SWING}$) to allow current to flow, e.g., sink to the first and/or second current sink NMOS transistors 510 or 512, respectively, in the delay cell 500.

In some implementations, the second pair of cross-coupled PMOS transistors includes first and second cross-coupled PMOS transistors 524 and 526, respectively. The first cross-coupled PMOS transistor 524 is implemented with its source connected to the power supply ($V_{DD}$), its gate connected to the drain of the second PMOS transistor 522, i.e., cross-coupled with the second PMOS transistor 522, and its drain connected to the first output ("OUTP"). The second cross-coupled PMOS transistor 526 is implemented with its source connected to the power supply ($V_{DD}$), its gate connected to the drain of the first PMOS transistor 520, i.e., cross-coupled with the first PMOS transistor 520, and its drain connected to the second output ("OUTM"). Thus, the second pair of cross-coupled PMOS transistors are controlled by the first and/or second current sink NMOS transistors 510 or 512, respectively, to allow current to flow, e.g., sink to the first and/or second current sink NMOS transistors 510 or 512, respectively, in the delay cell 500.

In operation, the delay cell 500 receives the differential inputs ("INM" and "INP") and, following a delay controlled by the voltage swing input ($V_{SWING}$), produces the differential outputs ("OUTM" and "OUTP"). The differential outputs may be output from the VCO for generating a PLL output at a given frequency To provide a wide frequency range of the PLL, the first current sink NMOS transistor 510 provides an alternate current path in the delay cell 500 when the second current sink NMOS transistor 512 is off (not conducting current from drain to source). The second current sink NMOS transistor 512 may be off, for example, due to saturation of the bias circuit driving the bias voltage input ($V_{BIAS}$) to ground ($V_{SS}$). The alternate current path allows current to sink from at least the first and second cross-coupled PMOS transistors 524 and 526, respectively, from source to drain, through the first and second input NMOS transistor 516 and 518, respectively, from drain to source, and through the first current sink NMOS transistor 510, from drain to source. This alternate current path provides increased current in the delay cell 500 so that a low voltage control input ($V_{CONTROL}$) at or near ground ($V_{SS}$), adjusted to maximize a delay in the cell, and causing saturation of the bias circuit driving the bias voltage input ($V_{BIAS}$) to ground ($V_{SS}$) and the voltage swing input ($V_{SWING}$) to the power supply ($V_{DD}$), does not inhibit operation of the cell, but rather allows the cell to operate through a wider frequency range. With the alternate current path, delay may be maximized in each cell to achieve a lower frequency than would otherwise be attainable, such as 50 MHz for a PLL having a loop bandwidth between 50 MHz and 3 GHz. Additionally, a high voltage control input ($V_{CONTROL}$) at or near the power supply ($V_{DD}$), adjusted to minimize the delay in the cell, and causing the voltage swing input ($V_{SWING}$) to be at or near ground ($V_{SS}$), is operable via sink current through the first and second PMOS transistors 520 and 522, respectively, from source to drain, through the first and second input NMOS transistor 516 and 518, respectively, from drain to source, and through the second current sink NMOS transistor 512, from drain to source. This allows delay to be minimized in each delay cell to achieve a higher frequency, such as 3 GHz for the PLL operating between 50 MHz and 3 GHz. Additionally, the alternate current path permits an output with less than 2% jitter and changing from one frequency to another with reduced settling time. For example, the VCO may produce an output with less than 2% jitter at a first frequency, such as less than 500 MHz, and then adjust during a settling time of less than 2000 cycles of the output, and more preferably less than 1000 cycles of the output, to produce the output with less than 2% jitter at a second frequency, such as greater than 2 GHz.

Additionally, to simplify start-up circuitry used by the PLL, the first current sink NMOS transistor 510 provides the alternate current path in the delay cell 500 when the second current sink NMOS transistor 512 is off during initialization (not conducting current from drain to source). For example, the second current sink NMOS transistor 512 may be off during a start-up condition in which the bias voltage input ($V_{BIAS}$) starts at ground ($V_{SS}$). The alternate current path may provide a sink current in the delay cell 500 during such initialization of the PLL, including the delay cell 500, so that the bias voltage input ($V_{BIAS}$) starting at ground ($V_{SS}$) does not stop the cell from beginning operation. As a result, implementations disclosed herein may allow simplifying start-up circuitry used by a PLL.

Figure 6:
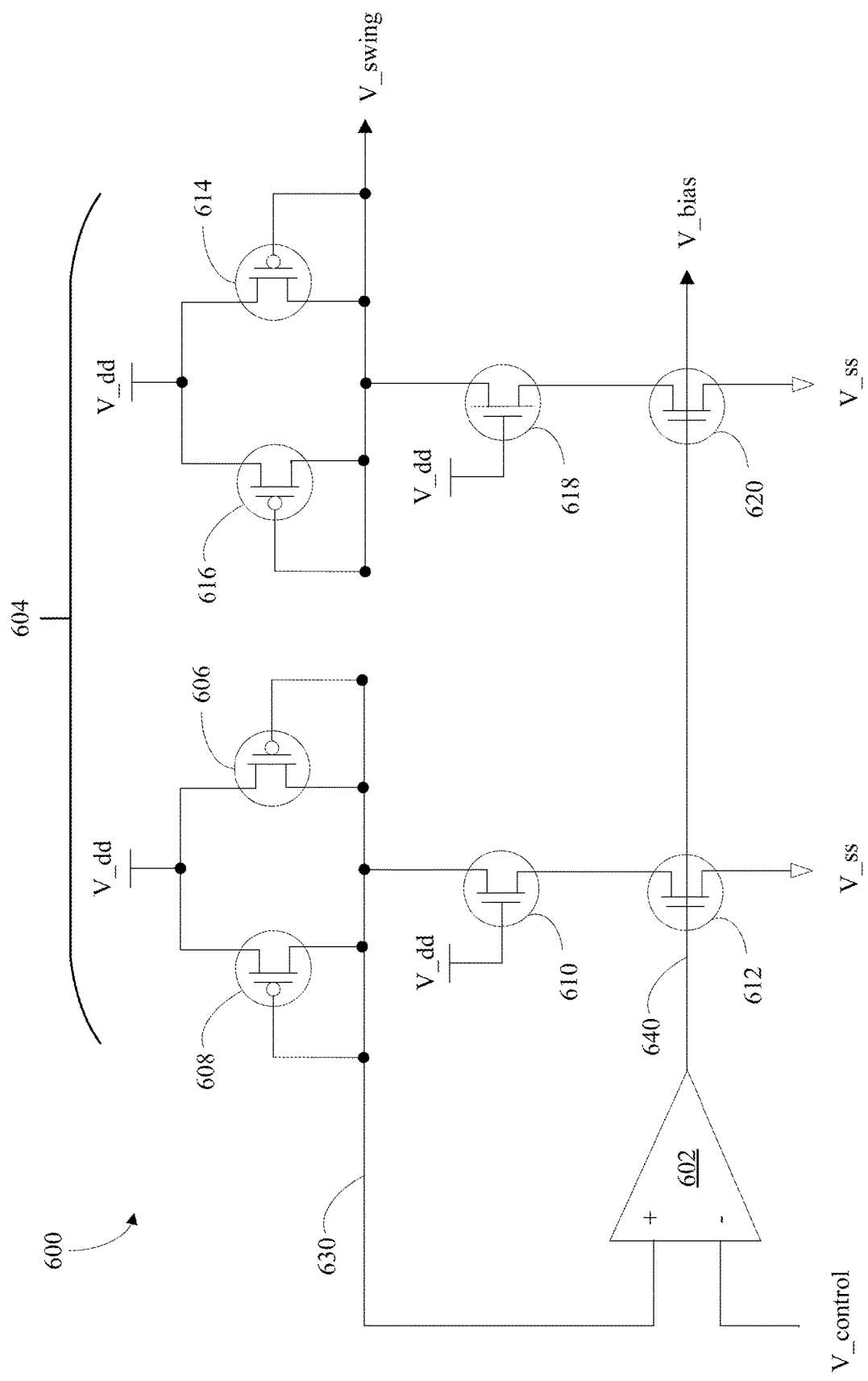
FIG. 6 is a circuit diagram of another example of a bias circuit for a delay cell.

FIG. 6 is a circuit diagram of an example of a bias circuit 600 which may be used to generate a bias voltage input ($V_{BIAS}$) for a VCO, such as the bias circuit 204 shown in FIG. 2. The bias circuit 600 may receive a voltage control input ($V_{CONTROL}$) at a voltage control terminal and, in turn, generate the bias voltage input ($V_{BIAS}$) at a bias voltage terminal. The bias voltage input ($V_{BIAS}$) may then be supplied to a delay cell, such as the delay cell 500 shown in FIG. 5. In some implementations, the bias circuit 600 may comprise a replica-feedback current sink bias circuit including an operational amplifier 602 connected to a replica circuit 604. The replica circuit 604 may include, for example, transistors 606, 608, 610, 612, 614, 616, 618, and 620 replicated from a delay cell. In operation, the operational amplifier 602 receives the voltage control input ($V_{CONTROL}$) and a feedback signal 630 and drives an output 640 to the replica circuit 604 to generate each of the bias voltage input ($V_{BIAS}$), the voltage swing input ($V_{SWING}$), and the feedback signal 630, in a loop.

As disclosed herein, the bias circuit 600 may encounter a condition in which the voltage control input ($V_{CONTROL}$) falls below a threshold voltage of an input transistor of the operational amplifier 602. This may cause the operational amplifier 602 to saturate, which, in turn, saturates or limits the bias voltage input ($V_{BIAS}$) generated by the operational amplifier 602. Saturation of the bias voltage input ($V_{BIAS}$) causes delay cells of the VCO to be limited to a lower frequency value. This, in turn, narrows the frequency range. However, in a delay cell with first and second current sinks in parallel with one another as disclosed herein, such as the first and second current sink NMOS transistors 510 and 512, respectively, as shown in FIG. 5, an alternate current path is provided in the delay cell. With the alternate current path, a low voltage control input ($V_{CONTROL}$) at or near ground ($V_{SS}$) does not inhibit operation of the cell, but instead allows the cell to operate through a wider frequency range.

Figure 7:
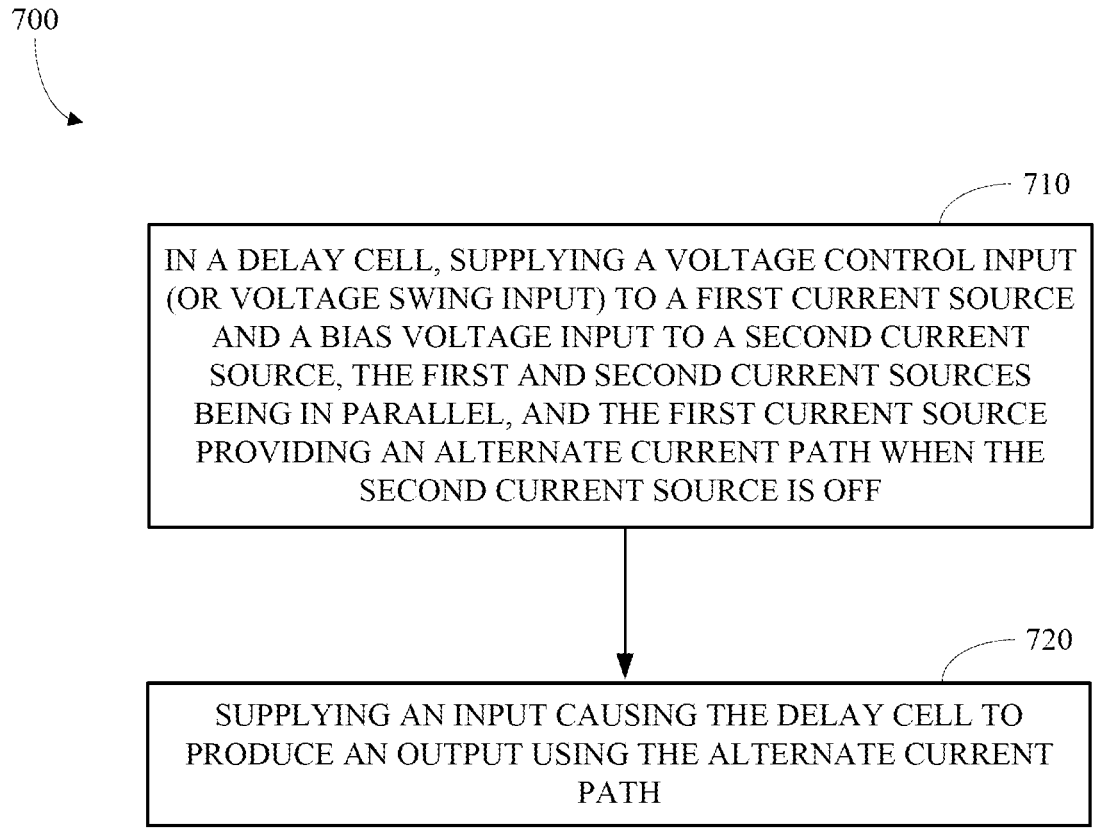
FIG. 7 is a flow chart of an example of a process for implementing a wide frequency range VCO.

FIG. 7 is a flow chart of an example of a process 700 for implementing a wide frequency range VCO. The process 700 includes supplying 710 a voltage control input ($V_{CONTROL}$) and bias voltage input ($V_{BIAS}$) to a delay cell of a VCO; and supplying 720 an input to the delay cell. For example, the process 700 may be implemented using the delay cell 300 of FIG. 3 or the delay cell 500 of FIG. 5.

The process 700 includes supplying 710 a voltage control input ($V_{CONTROL}$) connected to a voltage control terminal, or a voltage swing input ($V_{SWING}$) derived from the voltage control input ($V_{CONTROL}$), to a first current source, and supplying a bias voltage input ($V_{BIAS}$) connected to a bias voltage terminal to a second current source. The first and second current sources are in parallel with one another in a delay cell. The first and second current sources could be connected to a power supply or could be configured as first and second current sinks having connections to ground. The first current source provides an alternate current path in the delay cell when the second current source is off. For example, the first current source could provide the alternate current path when the second current source is off due to initialization or start-up of the PLL or due to saturation of a bias circuit producing the bias voltage input ($V_{BIAS}$).

The process 700 also includes supplying 720 an input to the delay cell. The input may be an oscillating differential input. The input causes the delay cell to produce an output using the alternate current path. That is, the delay cell uses the first current source to produce the output when the second current source is off. The output may be an oscillating differential output that is delayed from, and inverted with respect to, the oscillating differential input. The output may be used as a VCO output for generating a PLL output at a desired frequency. The input may be provided to produce the output using the alternate current path when the voltage control input ($V_{CONTROL}$) is adjusted to maximize a delay between the input and the output.

FIG. 8 is a flow chart of another example of a process 800 for implementing a wide frequency range VCO. The process 800 includes supplying 1010 an input to a delay cell of a VCO. For example, the process 800 may be implemented using the delay cell 300 of FIG. 3 or the delay cell 500 of FIG. 5.

The process 800 includes supplying an input to a VCO including a delay cell. The input may be an oscillating differential input. The delay cell includes first and second current sources in parallel with one another. The first and second current sources could be connected to a power supply or could be configured as first and second current sinks having connections to ground. The first current source is controlled by a voltage control input ($V_{CONTROL}$) connected to a voltage control terminal, or a voltage swing input ($V_{SWING}$) derived from the voltage control input ($V_{CONTROL}$), and the second current source is controlled by a bias voltage input ($V_{BIAS}$) connected to a bias voltage terminal.

The first current source provides an alternate current path in the delay cell when the second current source is off. The delay cell is operable to produce an output using the alternate current path. That is, the delay cell uses the first current source to produce the output when the second current source is off. The output may be an oscillating differential output that is delayed from, and inverted with respect to, the oscillating differential input. The output may be used as a VCO output for generating a PLL output at a desired frequency. The input may be provided to produce the output using the alternate current path when the voltage control input ($V_{CONTROL}$) is adjusted to maximize a delay between the input and the output.

Figure 9:
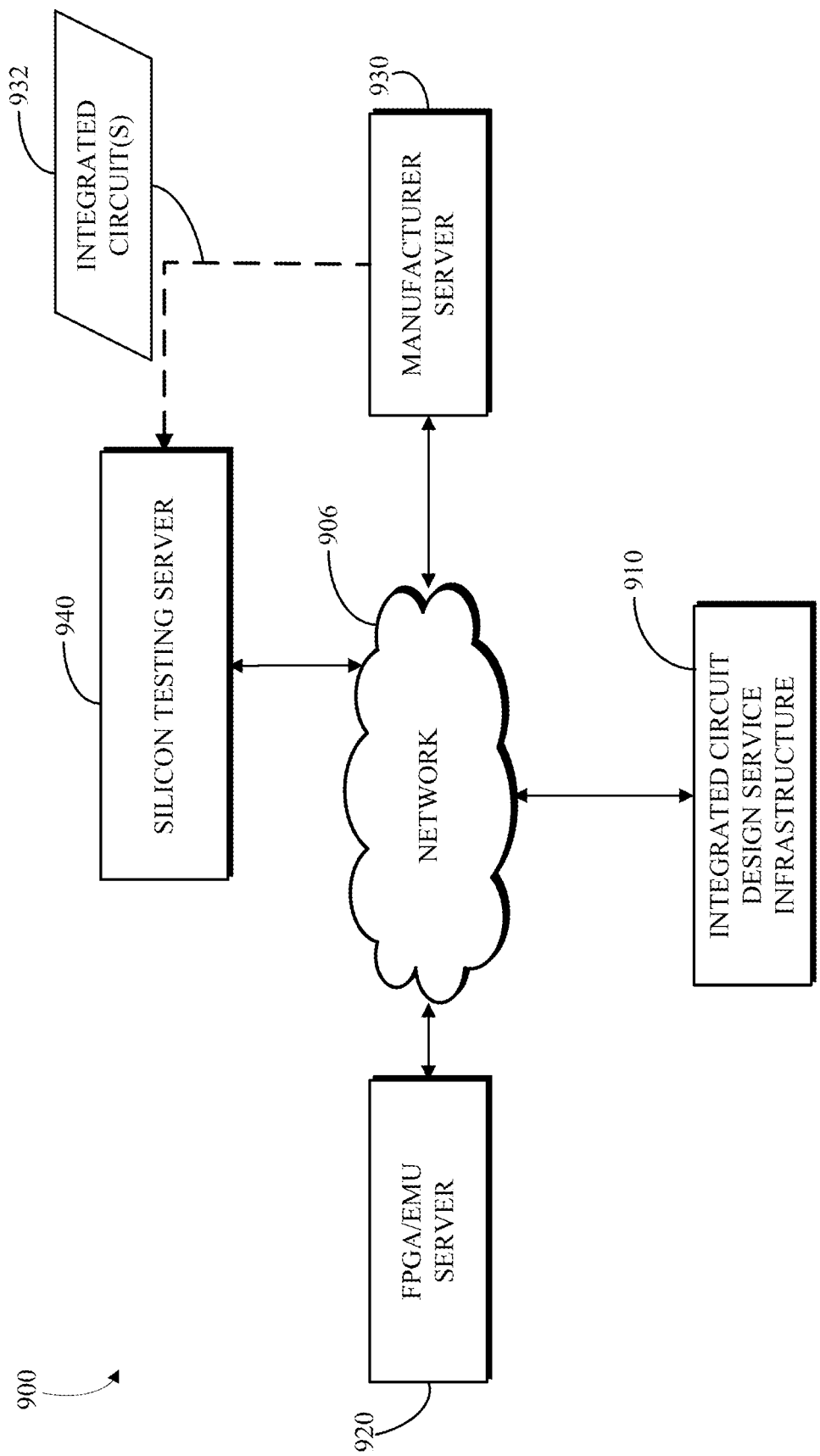
FIG. 9 is block diagram of an example of a system for facilitating generation and manufacture of integrated circuits.

FIG. 9 is block diagram of an example of a system 900 for generation and manufacture of integrated circuits. The system 900 includes a network 906, an integrated circuit design service infrastructure 910, a field programmable gate array (FPGA)/emulator server 920, and a manufacturer server 930. For example, a user may utilize a web client or a scripting API client to command the integrated circuit design service infrastructure 910 to automatically generate an integrated circuit design based a set of design parameter values selected by the user for one or more template integrated circuit designs. In some implementations, the integrated circuit design service infrastructure 910 may be configured to generate an integrated circuit design that includes the circuitry shown and described in FIGS. 1-6.

The integrated circuit design service infrastructure 910 may include a register-transfer level (RTL) service module configured to generate an RTL data structure for the integrated circuit based on a design parameters data structure. For example, the RTL service module may be implemented as Scala code. For example, the RTL service module may be implemented using Chisel. For example, the RTL service module may be implemented using flexible intermediate representation for register-transfer level (FIRRTL) and/or a FIRRTL compiler. For example, the RTL service module may be implemented using Diplomacy. For example, the RTL service module may enable a well-designed chip to be automatically developed from a high level set of configuration settings using a mix of Diplomacy, Chisel, and FIRRTL. The RTL service module may take the design parameters data structure (e.g., a java script object notation (JSON) file) as input and output an RTL data structure (e.g., a Verilog file) for the chip.

In some implementations, the integrated circuit design service infrastructure 910 may invoke (e.g., via network communications over the network 906) testing of the resulting design that is performed by the FPGA/emulation server 920 that is running one or more FPGAs or other types of hardware or software emulators. For example, the integrated circuit design service infrastructure 910 may invoke a test using a field programmable gate array, programmed based on a field programmable gate array emulation data structure, to obtain an emulation result. The field programmable gate array may be operating on the FPGA/emulation server 920, which may be a cloud server. Test results may be returned by the FPGA/emulation server 920 to the integrated circuit design service infrastructure 910 and relayed in a useful format to the user (e.g., via a web client or a scripting API client).

The integrated circuit design service infrastructure 910 may also facilitate the manufacture of integrated circuits using the integrated circuit design in a manufacturing facility associated with the manufacturer server 930. In some implementations, a physical design specification (e.g., a graphic data system (GDS) file, such as a GDS II file) based on a physical design data structure for the integrated circuit is transmitted to the manufacturer server 930 to invoke manufacturing of the integrated circuit (e.g., using manufacturing equipment of the associated manufacturer). For example, the manufacturer server 930 may host a foundry tape out website that is configured to receive physical design specifications (e.g., as a GDSII file or an OASIS file) to schedule or otherwise facilitate fabrication of integrated circuits. In some implementations, the integrated circuit design service infrastructure 910 supports multi-tenancy to allow multiple integrated circuit designs (e.g., from one or more users) to share fixed costs of manufacturing (e.g., reticle/mask generation, and/or shuttles wafer tests). For example, the integrated circuit design service infrastructure 910 may use a fixed package (e.g., a quasi-standardized packaging) that is defined to reduce fixed costs and facilitate sharing of reticle/mask, wafer test, and other fixed manufacturing costs. For example, the physical design specification may include one or more physical designs from one or more respective physical design data structures in order to facilitate multi-tenancy manufacturing.

In response to the transmission of the physical design specification, the manufacturer associated with the manufacturer server 930 may fabricate and/or test integrated circuits based on the integrated circuit design. For example, the associated manufacturer (e.g., a foundry) may perform optical proximity correction (OPC) and similar post-tapeout/pre-production processing, fabricate the integrated circuit(s) 932, update the integrated circuit design service infrastructure 910 (e.g., via communications with a controller or a web application server) periodically or asynchronously on the status of the manufacturing process, perform appropriate testing (e.g., wafer testing), and send to packaging house for packaging. A packaging house may receive the finished wafers or dice from the manufacturer and test materials and update the integrated circuit design service infrastructure 910 on the status of the packaging and delivery process periodically or asynchronously. In some implementations, status updates may be relayed to the user when the user checks in using the web interface and/or the controller might email the user that updates are available.

In some implementations, the resulting integrated circuits 932 (e.g., physical chips) are delivered (e.g., via mail) to a silicon testing service provider associated with a silicon testing server 940. In some implementations, the resulting integrated circuits 932 (e.g., physical chips) are installed in a system controlled by silicon testing server 940 (e.g., a cloud server) making them quickly accessible to be run and tested remotely using network communications to control the operation of the integrated circuits 932. For example, a login to the silicon testing server 940 controlling a manufactured integrated circuits 932 may be sent to the integrated circuit design service infrastructure 910 and relayed to a user (e.g., via a web client). For example, the integrated circuit design service infrastructure 910 may control testing of one or more integrated circuits 932, which may be structured based on an RTL data structure.

Figure 10:
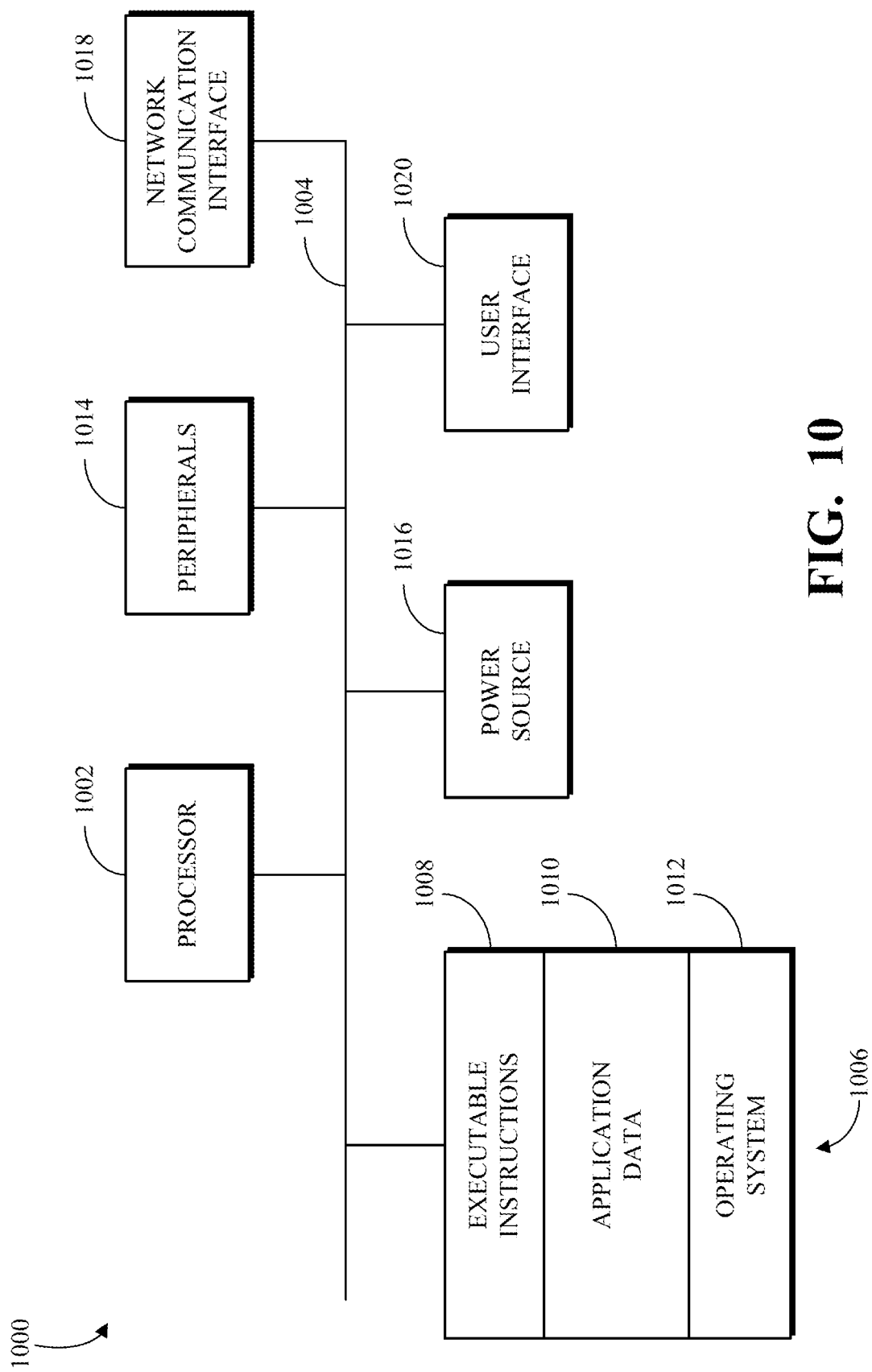
FIG. 10 is block diagram of an example of a system for facilitating generation of integrated circuits.

FIG. 10 is block diagram of an example of a system 1000 for facilitating generation of integrated circuits, for facilitating generation of a circuit representation for an integrated circuit, and/or for programming or manufacturing an integrated circuit. The system 1000 is an example of an internal configuration of a computing device. The system 1000 may be used to implement the integrated circuit design service infrastructure 910, and/or to generate a file that generates a circuit representation of an integrated circuit design including the circuitry shown and described in FIGS. 1-6. The system 1000 can include components or units, such as a processor 1002, a bus 1004, a memory 1006, peripherals 1014, a power source 1016, a network communication interface 1018, a user interface 1020, other suitable components, or a combination thereof.

The processor 1002 can be a central processing unit (CPU), such as a microprocessor, and can include single or multiple processors having single or multiple processing cores. Alternatively, the processor 1002 can include another type of device, or multiple devices, now existing or hereafter developed, capable of manipulating or processing information. For example, the processor 1002 can include multiple processors interconnected in any manner, including hard-wired or networked, including wirelessly networked. In some implementations, the operations of the processor 1002 can be distributed across multiple physical devices or units that can be coupled directly or across a local area or other suitable type of network. In some implementations, the processor 1002 can include a cache, or cache memory, for local storage of operating data or instructions.

The memory 1006 can include volatile memory, non-volatile memory, or a combination thereof. For example, the memory 1006 can include volatile memory, such as one or more DRAM modules such as double data rate (DDR) synchronous dynamic random access memory (SDRAM), and non-volatile memory, such as a disk drive, a solid state drive, flash memory, Phase-Change Memory (PCM), or any form of non-volatile memory capable of persistent electronic information storage, such as in the absence of an active power supply. The memory 1006 can include another type of device, or multiple devices, now existing or hereafter developed, capable of storing data or instructions for processing by the processor 1002. The processor 1002 can access or manipulate data in the memory 1006 via the bus 1004. Although shown as a single block in FIG. 10, the memory 1006 can be implemented as multiple units. For example, a system 1000 can include volatile memory, such as RAM, and persistent memory, such as a hard drive or other storage.

The memory 1006 can include executable instructions 1008, data, such as application data 1010, an operating system 1012, or a combination thereof, for immediate access by the processor 1002. The executable instructions 1008 can include, for example, one or more application programs, which can be loaded or copied, in whole or in part, from non-volatile memory to volatile memory to be executed by the processor 1002. The executable instructions 1008 can be organized into programmable modules or algorithms, functional programs, codes, code segments, or combinations thereof to perform various functions described herein. For example, the executable instructions 1008 can include instructions executable by the processor 1002 to cause the system 1000 to automatically, in response to a command, generate an integrated circuit design and associated test results based on a design parameters data structure. The application data 1010 can include, for example, user files, database catalogs or dictionaries, configuration information or functional programs, such as a web browser, a web server, a database server, or a combination thereof. The operating system 1012 can be, for example, Microsoft Windows®, macOS®, or Linux®; an operating system for a small device, such as a smartphone or tablet device; or an operating system for a large device, such as a mainframe computer. The memory 1006 can comprise one or more devices and can utilize one or more types of storage, such as solid state or magnetic storage.

The peripherals 1014 can be coupled to the processor 1002 via the bus 1004. The peripherals 1014 can be sensors or detectors, or devices containing any number of sensors or detectors, which can monitor the system 1000 itself or the environment around the system 1000. For example, a system 1000 can contain a temperature sensor for measuring temperatures of components of the system 1000, such as the processor 1002. Other sensors or detectors can be used with the system 1000, as can be contemplated. In some implementations, the power source 1016 can be a battery, and the system 1000 can operate independently of an external power distribution system. Any of the components of the system 1000, such as the peripherals 1014 or the power source 1016, can communicate with the processor 1002 via the bus 1004.

The network communication interface 1018 can also be coupled to the processor 1002 via the bus 1004. In some implementations, the network communication interface 1018 can comprise one or more transceivers. The network communication interface 1018 can, for example, provide a connection or link to a network, such as the network 906 shown in FIG. 9, via a network interface, which can be a wired network interface, such as Ethernet, or a wireless network interface. For example, the system 1000 can communicate with other devices via the network communication interface 1018 and the network interface using one or more network protocols, such as Ethernet, transmission control protocol (TCP), Internet protocol (IP), power line communication (PLC), wireless fidelity (Wi-Fi), infrared, general packet radio service (GPRS), global system for mobile communications (GSM), code division multiple access (CDMA), or other suitable protocols.

A user interface 1020 can include a display; a positional input device, such as a mouse, touchpad, touchscreen, or the like; a keyboard; or other suitable human or machine interface devices. The user interface 1020 can be coupled to the processor 1002 via the bus 1004. Other interface devices that permit a user to program or otherwise use the system 1000 can be provided in addition to or as an alternative to a display. In some implementations, the user interface 1020 can include a display, which can be a liquid crystal display (LCD), a cathode-ray tube (CRT), a light emitting diode (LED) display (e.g., an organic light emitting diode (OLED) display), or other suitable display. In some implementations, a client or server can omit the peripherals 1014. The operations of the processor 1002 can be distributed across multiple clients or servers, which can be coupled directly or across a local area or other suitable type of network. The memory 1006 can be distributed across multiple clients or servers, such as network-based memory or memory in multiple clients or servers performing the operations of clients or servers. Although depicted here as a single bus, the bus 1004 can be composed of multiple buses, which can be connected to one another through various bridges, controllers, or adapters.

A non-transitory computer readable medium may store a circuit representation that, when processed by a computer, is used to program or manufacture an integrated circuit. For example, the circuit representation may describe the integrated circuit specified using a computer readable syntax. The computer readable syntax may specify the structure or function of the integrated circuit or a combination thereof. In some implementations, the circuit representation may take the form of a hardware description language (HDL) program, a register-transfer level (RTL) data structure, a flexible intermediate representation for register-transfer level (FIRRTL) data structure, a Graphic Design System II (GDSII) data structure, a netlist, or a combination thereof. In some implementations, the integrated circuit may take the form of a field programmable gate array (FPGA), application specific integrated circuit (ASIC), system-on-a-chip (SoC), or some combination thereof. A computer may process the circuit representation in order to program or manufacture an integrated circuit, which may include programming a field programmable gate array (FPGA) or manufacturing an application specific integrated circuit (ASIC) or a system on a chip (SoC). In some implementations, the circuit representation may comprise a file that, when processed by a computer, may generate a new description of the integrated circuit. For example, the circuit representation could be written in a language such as Chisel, an HDL embedded in Scala, a statically typed general purpose programming language that supports both object-oriented programming and functional programming.

In an example, a circuit representation may be a Chisel language program which may be executed by the computer to produce a circuit representation expressed in a FIRRTL data structure. In some implementations, a design flow of processing steps may be utilized to process the circuit representation into one or more intermediate circuit representations followed by a final circuit representation which is then used to program or manufacture an integrated circuit. In one example, a circuit representation in the form of a Chisel program may be stored on a non-transitory computer readable medium and may be processed by a computer to produce a FIRRTL circuit representation. The FIRRTL circuit representation may be processed by a computer to produce an RTL circuit representation. The RTL circuit representation may be processed by the computer to produce a netlist circuit representation. The netlist circuit representation may be processed by the computer to produce a GDSII circuit representation. The GDSII circuit representation may be processed by the computer to produce the integrated circuit.

In another example, a circuit representation in the form of Verilog or VHDL may be stored on a non-transitory computer readable medium and may be processed by a computer to produce an RTL circuit representation. The RTL circuit representation may be processed by the computer to produce a netlist circuit representation. The netlist circuit representation may be processed by the computer to produce a GDSII circuit representation. The GDSII circuit representation may be processed by the computer to produce the integrated circuit. The foregoing steps may be executed by the same computer, different computers, or some combination thereof, depending on the implementation.

In a first aspect, the subject matter described in this specification can be embodied in an apparatus that includes a VCO including a delay cell, the delay cell including first and second current sources in parallel with one another, the first current source being controlled by a voltage control input connected to a voltage control terminal and the second current source being controlled by a bias voltage input connected to a bias voltage terminal, in which the first current source provides an alternate current path in the delay cell when the second current source is off, and in which the delay cell is operable to receive an input and produce an output using the alternate current path. In some implementations, the first current source provides the alternate current path when the second current source is off during initialization of the delay cell. In some implementations, the first current source provides the alternate current path when the second current source is off due to saturation of a bias circuit producing the bias voltage input. In some implementations, the delay cell is operable to produce the output using the alternate current path when the voltage control input is adjusted to maximize a delay between the input and the output. In some implementations, the delay cell is a first delay cell of multiple delay cells arranged in a ring, each delay cell providing an output as an input to a next delay cell in the ring. The ring may be configured to produce an oscillating VCO output from an output of a delay cell. The VCO output may have a frequency determined by a delay associated with the multiple delay cells in the ring. In some implementations, the VCO is operable to produce the VCO output at a frequency from 50 MHz to 3 GHz by adjusting the voltage control input. In some implementations, the VCO is operable to produce the VCO output with less than 2% jitter at a first frequency, such as less than 500 MHz, and adjust within 2000 cycles of the VCO output to produce the VCO output with less than 2% jitter at a second frequency, such as greater than 2 GHz. In some implementations, the apparatus may include a PLL output produced from the VCO output, a divider, and a phase detector, in which the divider is configured to divide the PLL output by a divisor to produce a feedback input to the phase detector, and in which the phase detector is configured to compare the feedback input to a reference input to produce an error for adjusting the voltage control input. In some implementations, the first and second current sources comprise first and second PMOS transistors, each PMOS transistor having its source connected to a power supply and its drain connected to a common node, in which current through the first PMOS transistor is controlled by the voltage control input applied to its gate, and in which current through the second PMOS transistor is controlled by the bias voltage input applied to its gate. In some implementations, the first and second current sources are configured as first and second current sinks connected to ground. In some implementations, the first and second current sinks comprise first and second NMOS transistors, each NMOS transistor having its source connected to ground and its drain connected to a common node, in which current through the first NMOS transistor is controlled by the voltage control input applied to its gate, and in which current through the second NMOS transistor is controlled by the bias voltage input applied to its gate.

In a second aspect, the subject matter described in this specification can be embodied in an apparatus that includes a VCO including a delay cell, the delay cell including: first and second current source PMOS transistors, each current source PMOS transistor having its source connected to a power supply and its drain connected to a common node, in which current through the first current source PMOS transistor is controlled by a voltage control input applied to its gate, and in which current through the second current source PMOS transistor is controlled by a bias voltage input applied to its gate; first and second input PMOS transistors, each input PMOS transistor having its source connected to the common node, the first input PMOS transistor having its gate connected to a first input and its drain connected to a first output, and the second input PMOS transistor having its gate connected to a second input and its drain connected to a second output; and first and second NMOS transistors, each NMOS transistor having its source connected to ground and its gate connected to the voltage control input, the first NMOS transistor having its drain connected to the first output, and the second NMOS transistor having its drain connected to the second output. In some implementations, the first current source PMOS transistor provides an alternate current path when the second current source PMOS transistor is off, and the first and second input PMOS transistors each conduct the first and second outputs, respectively, from source to drain using the alternate current path. In some implementations, the first current source PMOS transistor provides the alternate current path during initialization of the bias voltage input used to control the second current source PMOS transistor. In some implementations, the first current source PMOS transistor provides the alternate current path when the second current source PMOS transistor is off due to saturation of a bias circuit producing the bias voltage input. In some implementations, the first and second NMOS transistors comprise a first pair of NMOS transistors, and the apparatus includes a second pair of NMOS transistors cross coupled with the first pair of NMOS transistors, in which the first pair of NMOS transistors is five times larger than the second pair of NMOS transistors.

In a third aspect, the subject matter described in this specification can be embodied in an apparatus that includes a VCO including a delay cell, the delay cell including: first and second current sink NMOS transistors, each current sink NMOS transistor having its source connected to ground and its drain connected to a common node, in which current through the first current sink NMOS transistor is controlled by a voltage swing input applied to its gate, and in which current through the second current sink NMOS transistor is controlled by a bias voltage input applied to its gate; first and second input NMOS transistors, each input NMOS transistor having its source connected to the common node, the first input NMOS transistor having its gate connected to a first input and its drain connected to a first output, and the second input NMOS transistor having its gate connected to a second input and its drain connected to a second output; and first and second PMOS transistors, each PMOS transistor having its source connected to a power supply and its gate connected to the voltage swing input, the first PMOS transistor having its drain connected to the first output, and the second PMOS transistor having its drain connected to the second output. In some implementations, the first current sink NMOS transistor provides an alternate current path when the second current sink NMOS transistor is off, and the first and second input NMOS transistors each conduct the first and second outputs, respectively, from drain to source using the alternate current path. In some implementations, the first current sink NMOS transistor provides the alternate current path during initialization of the of the bias voltage input used to control the second current sink NMOS transistor. In some implementations, the first current sink NMOS transistor provides the alternate current path when the second current sink NMOS transistor is off due to saturation of a bias circuit producing the bias voltage input. In some implementations, the first and second PMOS transistors comprise a first pair of PMOS transistors, and the apparatus includes a second pair of PMOS transistors cross coupled with the first pair of PMOS transistors, in which the first pair of PMOS transistors is five times larger than the second pair of PMOS transistors.

In a fourth aspect, the subject matter described in this specification can be embodied in a method that includes supplying a voltage control input to a first current source and a bias voltage input to a second current source in a delay cell of a VCO, in which the first and second current sources are in parallel with one another, and in which the first current source provides an alternate current path in the delay cell when the second current source is off, and supplying an input to the delay cell, the input causing the delay cell to produce an output using the alternate current path. In some implementations, the first current source provides the alternate current path when the second current source is off during initialization of the delay cell. In some implementations, the first current source provides the alternate current path when the second current source is off due to saturation of a bias circuit producing the bias voltage input. In some implementations, the method includes supplying the input to produce the output using the alternate current path when the voltage control input is adjusted to maximize a delay between the input and the output. In some implementations, the method includes the VCO producing a VCO output at a frequency from 50 MHz to 3 GHz by adjusting the voltage control input. In some implementations, the method includes the VCO producing a VCO output with less than 2% jitter at a first frequency, such as less than 500 MHz, and adjusting within 2000 cycles of the VCO output to produce the VCO output with less than 2% jitter at a second frequency, such as greater than 2 GHz.

In a fifth aspect, the subject matter described in this specification can be embodied in a method that includes supplying an input to a VCO including a delay cell, the delay cell including first and second current sources in parallel with one another, the first current source being controlled by a voltage control input connected to a voltage control terminal and the second current source being controlled by a bias voltage input connected to a bias voltage terminal, in which the first current source provides an alternate current path in the delay cell when the second current source is off, and in which the delay cell is operable to produce an output using the alternate current path. In some implementations, the first current source provides the alternate current path during initialization of the second current source. In some implementations, the first current source provides the alternate current path when the second current source is off due to saturation of a bias circuit producing the bias voltage input. In some implementations, the method includes supplying the input to produce the output using the alternate current path when the voltage control input is adjusted to maximize a delay between the input and the output. In some implementations, the method includes the VCO producing a VCO output at a frequency from 50 MHz to 3 GHz by adjusting the voltage control input. In some implementations, the method includes the VCO producing a VCO output with less than 2% jitter at a first frequency, such as less than 500 MHz, and adjusting within 2000 cycles of the VCO output to produce the VCO output with less than 2% jitter at a second frequency, such as greater than 2 GHz.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures.

What is claimed is:

1. An apparatus comprising:
    a Voltage Controlled Oscillator (VCO) including a delay cell, the delay cell including first and second current sources in parallel with one another, the first current source being controlled by a voltage control input connected to a voltage control terminal and the second current source being controlled by a bias voltage input connected to a bias voltage terminal, wherein the first current source provides an alternate current path in the delay cell when the second current source is off, and wherein the delay cell is operable to receive an input and produce an output using the alternate current path, and
    a bias circuit configured to generate the bias voltage input based on the voltage control input.

2. The apparatus of claim 1, wherein the first current source provides the alternate current path when the second current source is off during initialization of the delay cell.

3. The apparatus of claim 1, wherein the first current source provides the alternate current path when the second current source is off due to saturation of a bias circuit producing the bias voltage input.

4. The apparatus of claim 1, wherein the delay cell is operable to produce the output using the alternate current path when the voltage control input is adjusted to maximize a delay between the input and the output.

5. The apparatus of claim 1, wherein the delay cell is a first delay cell of a plurality of delay cells arranged in a ring, each delay cell providing an output as an input to a next delay cell in the ring, the ring being configured to produce an oscillating VCO output from an output of a delay cell, the VCO output having a frequency determined by a delay associated with the plurality of delay cells in the ring.

6. The apparatus of claim 5, wherein the VCO is operable to produce the VCO output at a frequency from 50 MHz to 3 GHz by adjusting the voltage control input.

7. The apparatus of claim 5, wherein the VCO is operable to produce the VCO output with less than 2% jitter at a first frequency and adjust within 2000 cycles of the VCO output to produce the VCO output with less than 2% jitter at a second frequency.

8. The apparatus of claim 7, wherein the first frequency is less than 500 MHz and the second frequency is greater than 2 GHz.

9. The apparatus of claim 5, further comprising a PLL output produced from the VCO output, a divider, and a phase detector, wherein the divider is configured to divide the PLL output by a divisor to produce a feedback input to the phase detector, and wherein the phase detector is configured to compare the feedback input to a reference input to produce an error for adjusting the voltage control input.

10. The apparatus of claim 1, wherein the first and second current sources comprise first and second PMOS transistors, each PMOS transistor having its source connected to a power supply and its drain connected to a common node, wherein current through the first PMOS transistor is controlled by the voltage control input applied to its gate, and wherein current through the second PMOS transistor is controlled by the bias voltage input applied to its gate.

11. The apparatus of claim 1, wherein the first and second current sources are configured as first and second current sinks connected to ground.

12. The apparatus of claim 11, wherein the first and second current sinks comprise first and second NMOS transistors, each NMOS transistor having its source connected to ground and its drain connected to a common node, wherein current through the first NMOS transistor is controlled by the voltage control input applied to its gate, and wherein current through the second NMOS transistor is controlled by the bias voltage input applied to its gate.

13. A method comprising:
generating a bias voltage input based on a voltage control input using a bias circuit;
supplying the voltage control input to a first current source and the bias voltage input to a second current source in a delay cell of a VCO, wherein the first and second current sources are in parallel with one another, and wherein the first current source provides an alternate current path in the delay cell when the second current source is off, and
supplying an input to the delay cell, the input causing the delay cell to produce an output using the alternate current path.

14. The method of claim 13, wherein the first current source provides the alternate current path when the second current source is off during initialization of the delay cell.

15. The method of claim 13, wherein the first current source provides the alternate current path when the second current source is off due to saturation of a bias circuit producing the bias voltage input.

16. The method of claim 13, further comprising supplying the input to produce the output using the alternate current path when the voltage control input is adjusted to maximize a delay between the input and the output.

17. A method comprising:
generating a bias voltage input based on a voltage control input using a bias circuit;
supplying an input to a VCO including a delay cell, the delay cell including first and second current sources in parallel with one another, the first current source being controlled by the voltage control input connected to a voltage control terminal and the second current source being controlled by the bias voltage input connected to a bias voltage terminal, wherein the first current source provides an alternate current path in the delay cell when the second current source is off, and wherein the delay cell is operable to produce an output using the alternate current path.

18. The method of claim 17, wherein the first current source provides the alternate current path when the second current source is off during initialization of the delay cell.

19. The method of claim 17, wherein the first current source provides the alternate current path when the second current source is off due to saturation of a bias circuit producing the bias voltage input.

20. The method of claim 17, further comprising supplying the input to produce the output using the alternate current path when the voltage control input is adjusted to maximize a delay between the input and the output.

* * * * *